United States Patent
Gösele

[11] Patent Number: 6,010,591
[45] Date of Patent: Jan. 4, 2000

[54] METHOD FOR THE RELEASABLE BONDING AND SUBSEQUENT SEPARATION OF REVERSIBLY BONDED AND POLISHED WAFERS AND ALSO A WAFER STRUCTURE AND WAFER

[75] Inventor: Ulrich Gösele, Halle, Germany

[73] Assignee: Max-Planck-Gesellschaft Zur Foerderung Der Wissenschaften E.V., Munich, Germany

[21] Appl. No.: 08/974,278

[22] Filed: Nov. 19, 1997

[30]   Foreign Application Priority Data

Nov. 22, 1996 [DE] Germany .............. 196 48 501

[51] Int. Cl.[7] ...................................... B32B 31/00
[52] U.S. Cl. .................. 156/281; 156/344; 148/DIG. 12; 438/455; 438/456
[58] Field of Search ..................... 156/153, 154, 156/281, 344; 148/DIG. 12, DIG. 17; 438/455, 456

[56]   References Cited

U.S. PATENT DOCUMENTS

| 4,962,879 | 10/1990 | Goesele . | |
| 5,131,968 | 7/1992 | Wells et al. | 156/281 X |
| 5,882,987 | 3/1999 | Srikrishnan | 438/455 X |

FOREIGN PATENT DOCUMENTS

| 4404931A1 | 8/1994 | Germany . |
| 2-467722 | 2/1990 | Japan . |

OTHER PUBLICATIONS

Gösele, U., et al.: "Self-propagating room-temperature silicon wafer bonding in ultrahigh vacuum", *Appl Phys. Lett* 67 (24) (1995), pp. 3614–3616.

Gösele, U., et al.: "Particle Protection of Semiconductor Surfaces" by U.L. Mittal, Plenum Press, N.Y. (1991) pp. 239–247, reprinted in *Suss report*, vol. 8, 1994.

Gösele, U., et al.: "History and Future of Silicon Wafer Bonding", *Solid State Phenomena*, 47 & 48, 33–44 (1995).

*Primary Examiner*—Mark A. Osele
*Attorney, Agent, or Firm*—Townsend and Townsend and Crew LLP

[57]   ABSTRACT

A method for the releasable bonding of at least two wafers (10, 12), for example of two silicon wafers (silicon discs), or of a silicon wafer and a glass wafer, or of a semiconductor wafer and a cover wafer, by a wafer bonding method in which the surfaces to be brought into contact with one another are at least substantially optically smooth and flat. Prior to bringing the surfaces of the wafers (10, 12) into contact, one or more drops of a liquid are applied to at least one of the surfaces, and the wafer bonding method is carried out at least substantially at room temperature, or at a somewhat higher temperature, or optionally at a somewhat lower temperature. The wafers (10, 12) which are bonded together can easily be separated from one another in that at least the liquid enclosed between the wafers (10, 12), which are bonded to one another, is exposed to a temperature lying substantially above the bonding temperature at which the liquid vaporizes. A wafer structure is also disclosed.

21 Claims, 2 Drawing Sheets

METHOD FOR THE RELEASABLE BONDING AND SUBSEQUENT SEPARATION OF REVERSIBLY BONDED AND POLISHED WAFERS AND ALSO A WAFER STRUCTURE AND WAFER

FIELD OF THE INVENTION

The present invention relates to a method for the releasable bonding of at least two wafers, for example of two silicon wafers (silicon discs), or of a silicon wafer and a glass wafer, or of a semiconductor wafer and a cover wafer, in which the surfaces which are to be brought into contact against one another are at least substantially optically smooth and flat, and also to a wafer structure and to a wafer for use in such a wafer structure.

DESCRIPTION OF PRIOR ART

It is known that polished semiconductor wafers (for example silicon wafers for microelectronics) can be reversibly bonded hydrophilically or hydrophobically at room temperature, using the method of direct wafer bonding. The bond is reversible and can be separated again, provided the bonded discs are not heated beyond about 150° C. for longer periods of time of hours or more prior to separation.

It has been proposed in a method of the initially named kind to use this reversible bonding for the protection of the surfaces of the wafers during storage and transport of the same, and indeed in U.S. Pat. No. 4,962,879, and in the corresponding Japanese patent specification.

In this U.S. patent specification the method of wafer bonding is described in detail. It is explained there that the method can be practiced either in a clean room under clean room conditions, or however in an apparatus which is operated outside of or inside of a clean room and which can itself be considered as a type of miniaturized clean room. This apparatus comprises a rotatable rack, on which the two wafers to be connected together are first held at a distance from one another and flushed with deionized and filtered water. At the end of the flushing procedure, which can also take place, if required, while rotating the rack, the rotatable rack is operated in the manner of a spin dryer and indeed with a slightly lifted pot-like cap, so that the water can escape and the wafers are dried. The drying process can advantageously be accelerated by an infrared heating device. The wafers which are spaced apart in this apparatus are subsequently brought into contact by removal of the separating elements, whereby the wafer bonding method takes place automatically at least after exerting an initial local pressure at one point of the wafers.

It is a particular advantage of this method that one can check by an infrared inspection whether contamination, for example particles, is present between the wafers. These particles appear in the form of greatly enlarged "bubbles" in infrared interference images, which arise through the infrared inspection. Unevenness of the surface of the wafers which are bonded to one another can also be made visible in this manner.

It is therefore not only possible to check, during the manufacture of the bonded wafer structures, whether the wafers have the required cleanliness and surface quality, but one can in addition check once again prior to using the so-formed wafer structure, i.e. prior to separating the wafers and subsequent manufacture of semiconductor components, whether the wafer structures have remained clean. Since the surfaces of the wafers bond to one another, these remain protected over a longer period of time and can thus be transported and stored with substantially less cost and complexity and in smaller containers.

The method described in U.S. Pat. No. 4,962,879 can not only be used with silicon wafers but, for example, also for the wafer bonding of silicon and quartz wafers and many other discs and material pairs. For example, expression is given in U.S. Pat. No. 4,962,879 to the fact that most semiconductor wafers, for example also semiconductor wafers of gallium arsenide and indium phosphide, are supplied with a mirror smooth surface and can be protected for transport and storage by using the method described there for wafer bonding. It is also possible, for example with a gallium arsenide wafer, to protect this with a cover wafer of silicon, with the cost of the silicon wafer being substantially smaller than the cost for the wafer of gallium arsenide.

Further material pairs are also described in the article "History and Future of Semiconductor Wafer Bonding" by U. Gösele, H. Stenzel, M. Reiche, T. Martini and H. Steinkirchner in the Journal "Solid State Phenomina", 47 and 48, pages 33–44, 1995. This article also describes the surface conditions which must be satisfied in order to be able to practice wafer bonding as such at room temperature. In particular, a description is given there as to how smooth the surfaces must be and what characteristics they must have. The statements made there, as also the statements made in U.S. Pat. No. 4,962,879, apply in just the same way for the present invention and will not be described further here, because they are known in the prior art. They are, however, incorporated herein by reference.

In the method of U.S. Pat. No. 4,962,879 the separation of the bonded wafers takes place mechanically by the introduction of wedges between the wafers. However, in practice this mechanical separation can lead to contamination of or damage to the polished surfaces. In addition, it is difficult to carry out this type of separation automatically. This may be a reason why this method has not yet become established in industry.

OBJECT OF THE INVENTION

It is therefore an object of the present invention to propose a method or wafer structure which permits simple separation of the bonded wafers without the mechanical introduction of wedges, with the danger of contamination of or damage to the polished surfaces being minimized.

BRIEF DESCRIPTION OF THE INVENTION

This is attained by applying, one or more drops of a liquid to at least one of the surfaces prior to bringing the surfaces of the wafers into contact, and the wafer bonding method is carried out at least substantially at room temperature, or at a somewhat higher temperature, or optionally at a somewhat lower temperature.

In order to separate the bond, the wafers that are bonded together are exposed to a temperature lying significantly above room temperature, at which the liquid expands and vaporizes.

A wafer structure for satisfying this object is characterized in that a liquid is present at one or several positions or is distributed over the area of the surfaces of the wafers that are bonded together.

In other words, the customary, direct wafer bonding with hydrophilic or hydrophobic surfaces is to be used, however with the distinction that just prior to the actual bonding a small droplet of liquid is introduced between the two wafers and is later heated for the separation of the bonded wafers.

When using a liquid, this vaporizes during the heating and thus presses the two wafers apart through the pronounced increase in volume associated therewith. Since no wedges or mechanical devices have to be forced between the two wafers, there is no danger of damaging the polished surfaces. The method of the invention can readily be automated. It is merely necessary to hold the bonded wafer pair from the two sides in a suitable manner, for example by using a respective vacuum chuck to hold each of the wafers, and then to heat them to a temperature at which the enclosed liquid vaporizes so that the two wafers are separated by the corresponding increase in volume. The two individual wafers are completely pulled apart by the outer holding devices through the outwardly directed forces and are kept apart. It is, strictly speaking, not necessary to heat the wafer itself. Instead of this it is sufficient to simply heat the liquid, for example by microwave energy.

Deionized and filtered water represents the preferred liquid because of the low danger of contamination. Deionized and filtered water is a liquid which is customarily used in the manufacture of semiconductor components and is thus a liquid which is both present and can also be used in a manner appropriate to the process.

The invention is, however, not restricted to the use of deionized and filtered water as a liquid and other liquids can also be considered. Liquids are, however, preferably used which have a boiling point below 150° C. at normal pressure, because the heating up of the wafers beyond this temperature is not desired.

The correct volume of the liquid droplet depends on the diameter, on the thickness and on the elastic constants of the bonded wafers. The liquid selected should, in any event, not contain any impurities which could be deleterious for the further treatment of the wafers. The use of water droplets in connection with hydrophobic wafers represents a particularly favorable combination.

The liquid can be distributed uniformly over the surface of the bonded wafers. In this case only so much water should be used that the water layer has a thickness of 1 molecule or at most about 10 molecules. Very thick layers do not permit the wafers to be permanently bonded to one another and at the same time involve the danger that a loss of water occurs by vaporization.

With wafers that are bonded to one another with only a very thin layer between the two surfaces, preferably of the thickness of only one water molecule, one can have the justified hope that a loss of water does not occur, or only occurs over very long periods of time.

In accordance with one aspect of the Invention which the liquid is introduced into one or more recesses in the surfaces of at least one of the wafers. In this way, the danger of evaporation is precluded with very high probability, because the surfaces of the wafers that are bonded together are arranged so close to one another that the molecules of the liquid or of the solid material cannot escape.

The recess is preferably arranged in the central region of the wafer, because the increase in volume or the increase in pressure which leads to the separation of the wafers can develop a particularly favorable action here, since the distance from the central region of the wafer up to the marginal edge is uniformly short.

Even though a small recess in the central region of the wafer should not actually be disturbing as such, a recess could, nevertheless, be regarded as disturbing. The possibility thus offers itself of forming the recess or recesses in the marginal region of the wafer and indeed, for example, in the region of the customary flattened portion where the wafers frequently have a special characteristic marking.

DESCRIPTION OF PREFERRED EMBODIMENTS

Figure 1:
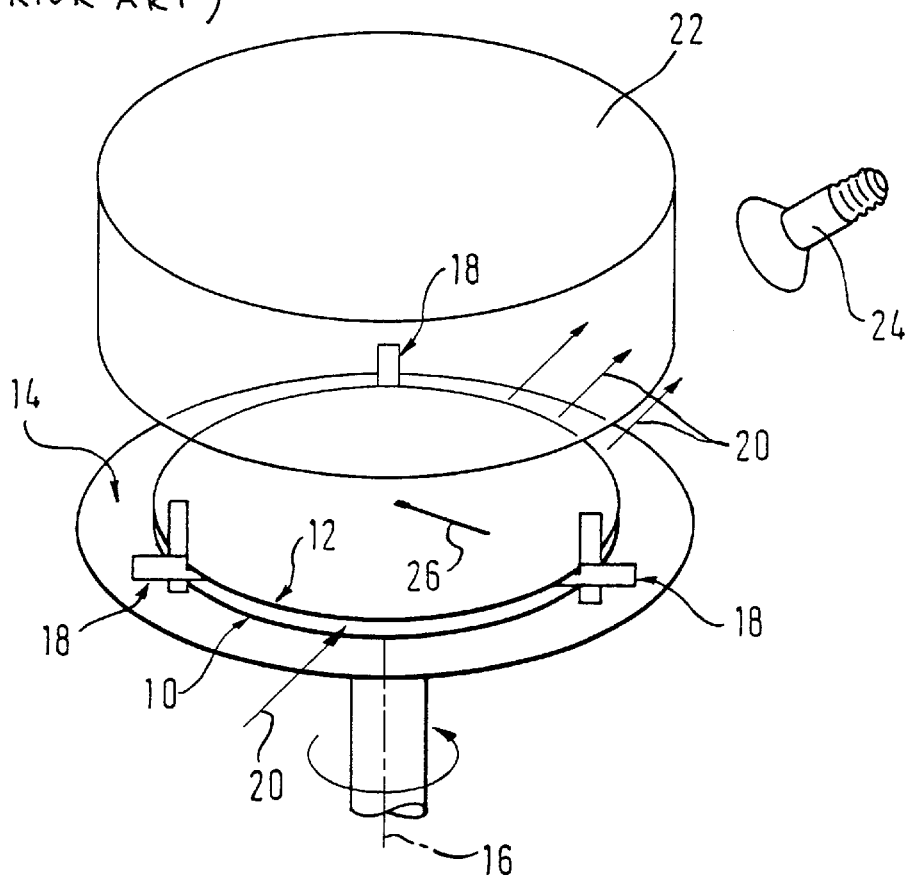
FIG. 1 corresponds to FIG. 1 of U.S. Pat. No. 4,962,879.

In FIG. 1 there are shown two silicon discs 10 and 12 which can have, for example, a diameter of 4 inches (10cm) and a thickness of 350 to 550 $\mu$m, with the mutually confronting surfaces of the two wafers 10 and 12 being polished to mirror smoothness. The two discs 10 and 12 are carried by a rotatable rack 14, which is rotatable about the central longitudinal axis 16. The rotatable rack can, for example, consist of Teflon (polytetrafluoroethylene). In order to avoid a contact of the surfaces during the cleaning and flushing, these are kept apart by means of spacer elements 18 with a thickness of approximately 550 $\mu$m, which for example also consist of Teflon.

The distance between the wafers should be kept in the range between 10 and 1000 $\mu$m. The rack with the wafers is then dipped into a hydrophilization bath of 300 ml of $H_2O$, 50 ml of $H_2O_2$, 200 ml of $NH_4OH$ at a temperature of between 50° C. and 60° C. for about two to five minutes. Thereafter the gap between the wafers is flushed for approximately five minutes with well-filtered and deionized water (water flow 20). The wafers are preferably rotated by means of the rotatable rack 14 about the axis 16 relative to the water flow 20 during the flushing process, or the water flow is rotated relative to the wafers. Through this method, hydrophilic wafer surfaces faces arise. After this flushing process, the rack 14 with the wafers is operated horizontally aligned in the manner of a spin dryer and closed with a pot-like cap 22, whereby, however, a small gap is present between the cap 22 and the rim region of the rotatable rack 14, through which water can escape in the manner of a spin dryer on rotation of the rack about the axis 16. The spin drying process takes place at approximately 3000 rpm. After some minutes, this process is terminated. The time requirement for this can also be shortened if the water is heated up with an infrared lamp 24 to about 45° C. or more during the spin drying process.

It is also possible to operate with hydrophobic wafer surfaces. In order to produce such surfaces, the frame with the wafers is dipped into a 1% HF bath and subsequently dried by a spin drying process, and this time without flushing with water or any other liquid.

After the conclusion of the drying process— independently of whether one is concerned with hydrophilic or hydrophobic wafers—a water droplet is introduced between the wafers in accordance with the invention, for example, by means of a small cannula. The spacers 18 are subsequently removed. Through a light pressure on the wafers, the water is distributed over the boundary surfaces between the two wafers, which is then also promoted by the capillary forces. On exerting a light pressure, at one point of the wafer structure, for example by means of a pincer-like tool 26, wafers bond to one another over at least substantially their full area.

The temperature which can be used in practice by using the infrared lamp amounts to ca. 90° C., and a statement in the claims, in accordance with which the bonding process can take place at a somewhat higher temperature, should be understood in this sense.

Figure 2:
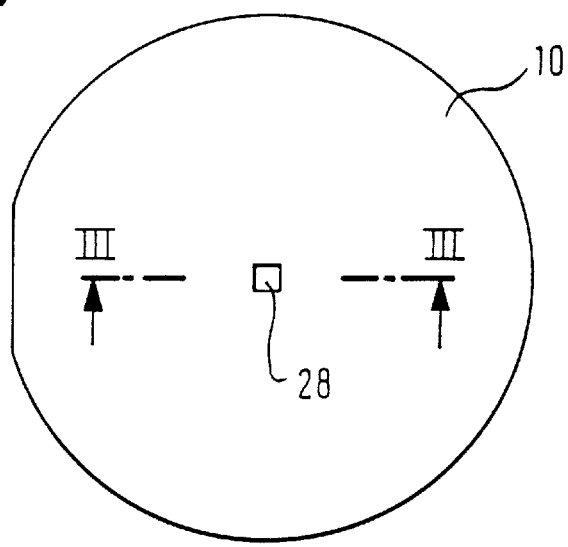
FIG. 2 is a plan view of a wafer in accordance with the invention, with a recess for receiving the liquid.
Figure 3:
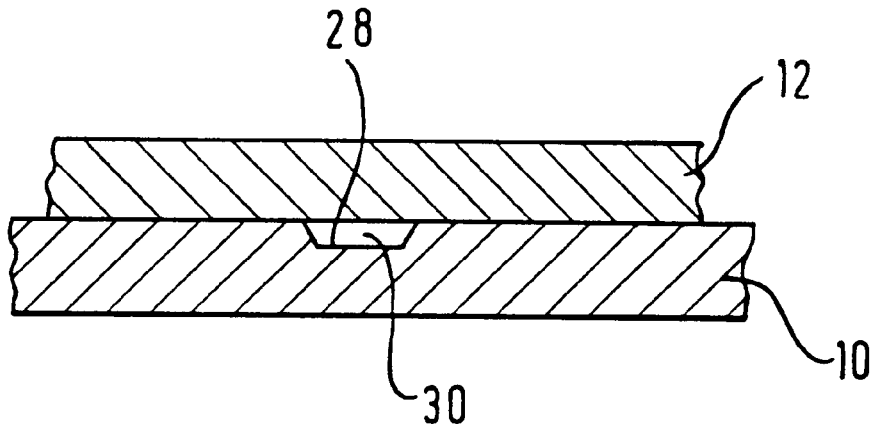
FIG. 3 is a section drawing through the recess of FIG. 2 on an enlarged scale, and after the application of the second wafer.

Instead of distributing the liquid between the wafers, it can be introduced into a recess 28 in the surface of one of the wafers, as can be seen from FIGS. 2 and 3.

As can be seen in particular from FIG. 3, the recess forms a hollow cavity 30 closed on all sides after the wafer bonding, in which the liquid is contained.

Figure 4:
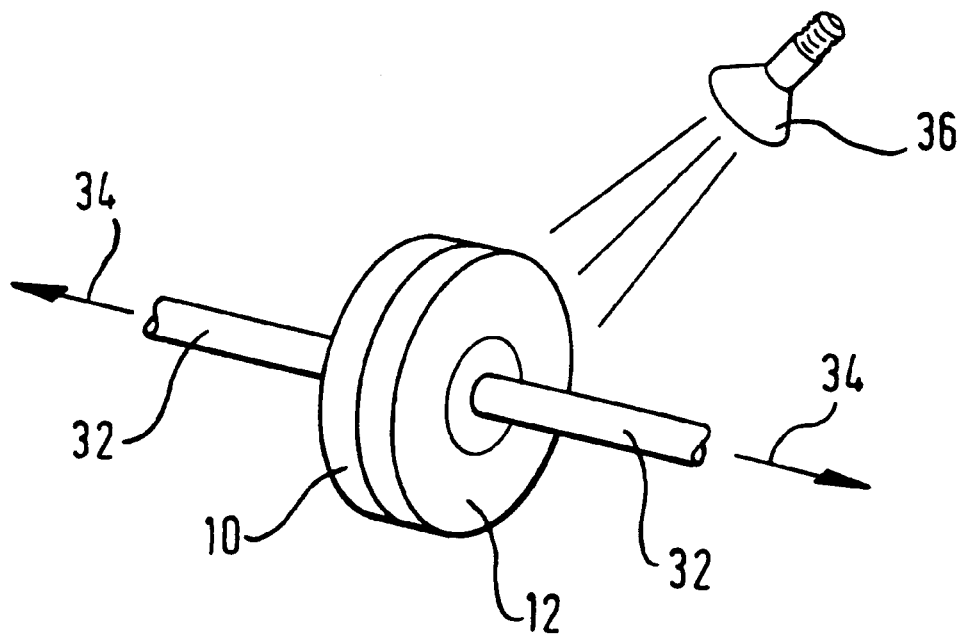
FIG. 4 is a schematic illustration of the separation of bonded wafers.

For storage and for transport of the so bonded together wafers, an apparatus can be used in accordance with FIGS. 5 or 6 of U.S. Pat. No. 4,962,879. For the separation of the wafers bonded together the pair is inserted into the apparatus of FIG. 4. The reference numerals 32 point to two vacuum chucks, which exert a pre-stressing force onto the two wafers in the direction apart from one another, as indicated by the arrow 34. By switching on the infrared lamp 36, the liquid between the two wafers 10 and 12 is heated up so that the liquid vaporizes. Through this increase in volume, the two wafers are pressed apart. Through the vacuum chucks 32, the two wafers are then pulled apart and are kept spaced apart at a distance at which renewed wafer bonding is precluded.

This distance should be kept relatively small, because one has found, in accordance with the invention, that when this distance remains small, the danger of contamination of the surfaces is very low. There is, so to speak, no exchange of air between the narrow gap and the environment which could lead to the contamination of the surfaces.

The separation can accordingly either take place in a clean room or, however, in an enclosed chamber, which represents a type of small clean room.

Prior to carrying out the separation method, the quality of the surfaces can be checked through infrared images, and indeed with respect to whether contamination is present in the boundary surface between the two wafers, or whether the wafers themselves have unevennesses which are not allowed.

It is also conceivable to use a sublimating solid material in place of a water droplet, with the solid material first being heated so that it sublimates, with the corresponding molecules then depositing between the wafers in a thin, quasi monomolecular layer. This is favored in that the wafers have a temperature beneath the sublimation temperature. The two wafers can also be pressed together here in order to conclude the wafer bonding process.

What is claimed is:

1. Method for releasably bonding at least two wafers having surfaces to be brought into contact with one another that are at least substantially optically smooth and flat and that form at least one recess prior to bringing the surfaces of the wafers into contact, the method comprising the steps of applying one or more drops of a liquid into the at least one recess and maintaining a temperature of the liquid in a range between somewhat higher to somewhat lower than room temperature.

2. Method in accordance with claim 1 including uniformly distributing the liquid prior to bringing the surfaces of the wafers into contact over at least one of the surfaces and selecting a quantity of liquid sufficient to form, in distributed form, a layer of liquid having the thickness in a range between one molecule and ten molecules of the liquid.

3. Method in accordance with claim 1 including forming a plurality of recesses in at least one of the surfaces to be brought into contact.

4. Method in accordance with claim 3, comprising forming the recess in one of a central region of the at least one wafer and a marginal region.

5. Method in accordance with claim 4 wherein the step of forming comprises forming the recess in a customary flattened portion of the marginal region.

6. Method in accordance with claim 4 wherein forming the recess comprises forming it in a marked margin of the marginal region.

7. Method in accordance with claim 1, characterized in that the quantity of liquid corresponds at least substantially to the volume of the recess.

8. Method in accordance with claim 1 comprising using deionized and filtered water as the liquid.

9. Method in accordance with claim 8 comprising making the surfaces to be brought into contact hydrophobic.

10. Method according to claim 1 including separating the previously bonded wafers by exposing at least the liquid between the wafers to a temperature substantially above a temperature at which the liquid vaporizes.

11. Method in accordance with claim 10 comprising holding the bonded wafers in respective, oppositely disposed vacuum chucks, pre-stressing the wafers in a direction away from each others and in this state subjecting the liquid between the wafers to the temperature substantially above room temperature.

12. Wafer structure comprising at least two wafers bonded to one another by a layer of a liquid between opposing surfaces of the wafers, a recess formed by at least one of the surfaces, and wherein the liquid is present at one or more points distributed over areas of the surfaces of the wafers that are bonded to one another.

13. Wafer structure in accordance with claim 13, wherein a quantity of the liquid corresponds at least substantially to a volume of the recess.

14. Wafer structure in accordance with claim 12 wherein the recess is arranged in one of a central region of the at least one wafer and a marginal region of the at least one wafer.

15. Wafer structure according to claim 14 wherein the recess is in a usually flattened portion of the marginal region.

16. Wafer structure in accordance with claim 14 wherein a portion of the recess is located in a marked margin of the marginal region.

17. Wafer structure in accordance with claim 12 wherein the liquid is deionized and filtered water.

18. Wafer structure in accordance with claim 12 including arranging at least one wafer in a container.

19. Wafer for use in a wafer structure including at least two wafers releasably bonded to each other by a layer of a liquid between them, the wafer comprising at least one recess for the reception of a liquid and located in one of a central region and a marginal region of the wafer.

20. Method for separating first and second wafers having opposing surfaces that are at least substantially optically smooth and flat, the wafers being releasably bonded to each other by a liquid disposed between the opposing surfaces, the method comprising exposing the liquid to a temperature substantially above a temperature at which the liquid vaporizes to thereby cause a release of the bond between the wafers and their separation from each other.

21. Method according to claim 20 further comprising holding the bonded wafers in respective, oppositely disposed vacuum chucks, pre-stressing the wafers in a direction away from each other, and while the wafers are pre-stressed subjecting the liquid between the wafers to a temperature substantially above room temperature.

* * * * *